United States Patent [19]

Piotrowski

[11] 4,260,431

[45] Apr. 7, 1981

[54] METHOD OF MAKING SCHOTTKY BARRIER DIODE BY ION IMPLANTATION AND IMPURITY DIFFUSION

[75] Inventor: Leo R. Piotrowski, Indian Harbour Beach, Fla.

[73] Assignee: Harris Corporation, Melbourne, Fla.

[21] Appl. No.: 106,128

[22] Filed: Dec. 21, 1979

[51] Int. Cl.³ .......................... H01L 29/90; B01J 7/00; B01J 17/00
[52] U.S. Cl. ..................................... 148/1.5; 148/187; 357/15; 357/91
[58] Field of Search ................... 148/1.5, 187; 357/91, 357/15

[56] References Cited

U.S. PATENT DOCUMENTS

| | | | |
|---|---|---|---|
| 3,846,192 | 11/1975 | Murrmann | 148/175 |
| 3,865,649 | 2/1975 | Beasom | 148/187 |
| 4,035,907 | 7/1977 | Allen et al. | 29/590 |
| 4,045,248 | 8/1977 | Shannon et al. | 148/1.5 |
| 4,089,020 | 5/1978 | Ikeda et al. | 357/15 |
| 4,096,622 | 6/1978 | MacIver | 29/578 |
| 4,099,260 | 7/1978 | Lynes et al. | 365/105 |
| 4,107,719 | 8/1978 | Graul et al. | 357/15 |
| 4,149,174 | 4/1979 | Shannon | 357/13 |

OTHER PUBLICATIONS

Berger et al., IBM.-Tech. Discl. Bull. 14 (1971) 302.
Calhoun et al., IBM-Tech. Discl. Bull. 18 (1975) 1847.
Knepper, R. W., IBM-Tech. Discl. Bull. 17 (1974) 1609.

*Primary Examiner*—L. Dewayne Rutledge
*Assistant Examiner*—Upendra Roy
*Attorney, Agent, or Firm*—Leitner, Palan, Martin & Bernstein

[57] ABSTRACT

A Schottky barrier diode is formed in a low impurity concentration N-type substrate by ion implanting N-type impurities to form a deep region having increased impurity surface concentration of at least $10^{16}$ carriers per cubic centimeters, forming P-type guard ring in the deep N-type region and forming an N+ contact region in the deep N-type region. NPN transistors can be fabricated in the original low impurity substrate or in an ion implanted substrate region having a lower breakdown voltage. Schottky clamped NPN transistors formed in the low impurity substrate include ion implanted regions interior to a base ring and extending down into a buried N+ collector region as does an ion implanted surface collector contact region having an N+ contact area.

9 Claims, 5 Drawing Figures

METHOD OF MAKING SCHOTTKY BARRIER DIODE BY ION IMPLANTATION AND IMPURITY DIFFUSION

BACKGROUND OF THE INVENTION

The present invention relates generally to Schottky barrier diodes, and more specifically to an ion implanted Schottky barrier diode.

Generally, Schottky barrier diodes are fabricated in low concentration N-type material, for example, 0.1 to 0.2 ohm-centimeters. An example of the prior art for the simultaneous formation of Schottky barrier diodes with P-type guard rings and a Schottky clamped NPN bipolar transistor is described in U.S. Pat. No. 4,035,907. The starting material is an N epitaxial material of the appropriate impurity concentration to produce the low resistivity starting material. Another example is U.S. Pat. No. 3,846,192 wherein the formation of an NPN bipolar transistor and Schottky diodes of two different thresholds are formed by selective N-type diffusion into an N epitaxial layer having a low resistance of 0.8 ohm-centimeters. The use of ion implantation to form an N⁻ region capable of forming a Schottky barrier is illustrated in U.S. Pat. No. 4,099,260. N-type impurities are ion implanted and diffused into a P-type substrate. Ion implantation has also been used to form a shallow surface layer of a higher impurity level than the bulk semiconductor body portion of Schottky barrier device to control the height of the barrier. This is illustrated in U.S. Pat. No. 4,045,248.

Linear type integrated circuits to provide high voltage complementary bipolar transistors generally use an N-type starting material having a bulk resistance in the range of three to twenty ohm-centimeters. The starting material is unsuitable for the formation of acceptable or useful Schottky barrier diodes. The prior art discussed above generally deals with the formation of Schottky barrier diodes and the possible formation of additional devices therewith. Thus, they have started with an appropriately low resistive material to assure the formation of the Schottky barrier diode. Starting with high resistive starting material required for high voltage complementary bipolar transistors, a way must be found to modify the starting material so as to produce useful Schottky barrier diodes. The criteria for useful Schottky barrier diodes is that the forward voltage be lower than a diffused PN junction diode, it should have a low reverse leakage, it should have a low series resistance, and it should have a sufficient reverse breakdown.

SUMMARY OF THE INVENTION

An object of the present invention is to provide a method of fabricating useful Schottky barrier diodes in an N-type starting material having a bulk resistance in the range of three to twenty ohm-centimeters.

Another object of the present invention is to provide a method of fabricating low forward voltage, low series resistance Schottky barrier diodes in starting materials of high voltage complementary bipolar transistors.

An even further object of the present invention is to provide a method of fabricating useful Schottky barrier diodes in high resistance starting material which is compatible with the process for forming standard and low breakdown NPN transistors.

Still an even further object of the present invention is to provide a method of fabricating useful Schottky barrier diodes in dielectrically isolated regions wherein the starting material has a bulk resistance in the range of three to twenty ohm-centimeters.

These and other objects of the present invention are attained by modifying the initial starting material having a high resistance in the range of three to twenty ohm-centimeters by ion implanting N-type impurities and diffusing to a deep depth to increase the surface impurity concentration and decrease the resistance to form an acceptable Schottky barrier diode. P-type impurities are then introduced and diffused into the ion implanted region to form a P-type guard ring and N-type impurities are subsequently diffused to form a high impurity N+ concentration contact region in the ion implanted region exterior of the guard ring. Metal contacts are then applied and delineated to form Schottky barrier contacts to the ion implanted region at the area between the P guard rings and ohmic contact to the high impurity N+ contact region. The N+ contact diffusion may be deeper than the P guard ring and if desired contact a buried N+ region. The forward voltage, low series resistance and sufficient breakdown characteristics are a function of the impurity concentration. The low reverse leakage is produced by the P-type guard ring.

Standard NPN, low breakdown NPN and Schottky clamped NPN bipolar transistors may also be formed in the same starting material in dielectrically isolated islands by the addition of a second N+ diffusion. Substantially, the entire starting material of the low breakdown and two spaced regions of the Schottky clamped bipolar transistors are also subject to the N ion implantation and deposition. The ion implantation and diffusion are carried out sufficiently long such that the ion implanted regions extend from the surface down to a high impurity N+ buried layer region. The P-type impurities diffusion to form the P-type guard ring is also used to form the base regions of the NPN transistors including a base ring for the Schottky clamped NPN transistor. The N-type impurity diffusion to form the contact region is also used to form deep, low resistance collector contact regions to the starting material for the standard NPN, to the ion implanted region of the low breakdown NPN and to the ion implanted collector region of the Schottky clamped NPN. A second N+ diffusion forms an emitter in each of the three P+ base regions. Metal is applied and delineated to form ohmic contacts to the collector, base and emitter regions of the NPN transistors with the exception of a Schottky contact to the ion implanted region which is surrounded by the P-type base ring of the Schottky clamped NPN bipolar transistor.

Other objects, advantages and novel features of the present invention will become evident when considered in conjunction with the accompanying drawings.

DESCRIPTION OF THE PREFERRED EMBODIMENTS

Figure 1:
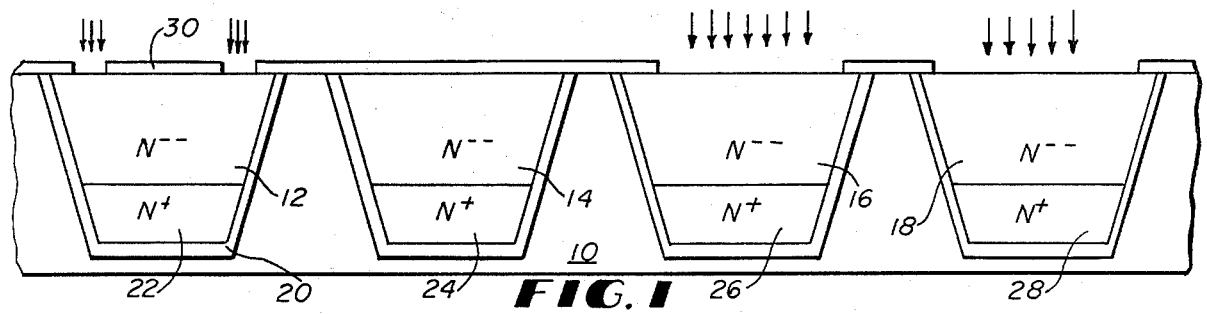
FIGS. 1 through 5 are cross-sectional views of a wafer at various stages illustrating the method of fabricating ion implanted Schottky barrier diodes according to the principles of the present invention.

High voltage complementary bipolar transistors are usually formed in dielectrically isolated regions. As illustrated in FIG. 1, a base or support 10, for example polycrystalline material, has a plurality of $N^{--}$ regions 12, 14, 16 and 18 formed therein and dielectrically isolated from the polycrystalline substrate 10 and from each other by an insulative layer 20 which may be, for example, an oxide. Buried in each starting $N^{--}$ region is a high impurity $N^+$ buried layer 22, 24, 26 and 28 respectively. The four islands 12, 14, 16 and 18 are but an example of the plurality of islands which may be formed in the polycrystalline support 10. For example, other $N^{--}$ islands may be formed without a buried N' region. Similarly, P-type islands may be formed with $P^+$ buried regions.

One example of the method of forming the dielectrically isolated islands is described in U.S. Pat. No. 3,865,649 to J. D. Beasom. The islands 12, 14, 16 and 18 are formed from a starting material which may be an N-type single crystal silicon doped with, for example, antimony, having a resistance in the range of three to twenty ohm-centimeters. This is equivalent to an impurity concentration of $1.6 \times 10^{15}$ carriers per cubic centimeter for 3 ohm-centimeters and $2.4 \times 10^{14}$ carriers per cubic centimeter for 20 ohm-centimeters. The $N^+$ regions 22, 24, 26 and 28 are formed by diffusing N-type impurities into the $N^{--}$ substrate and have a resistance of generally 0.01 ohm-centimeters and an impurity concentration in the range of $1 \times 10^{19}$ carriers per cubic centimeter. The starting material is etched, covered with the oxide region 20 and filled with the polycrystalline substrate 10. After a grinding operation, the structure of FIG. 1 results. This is but an example of one method of forming the structure of FIG. 1 and does not constitute part of the present invention other than to set the design criteria to which the present invention applies.

Figure 2:
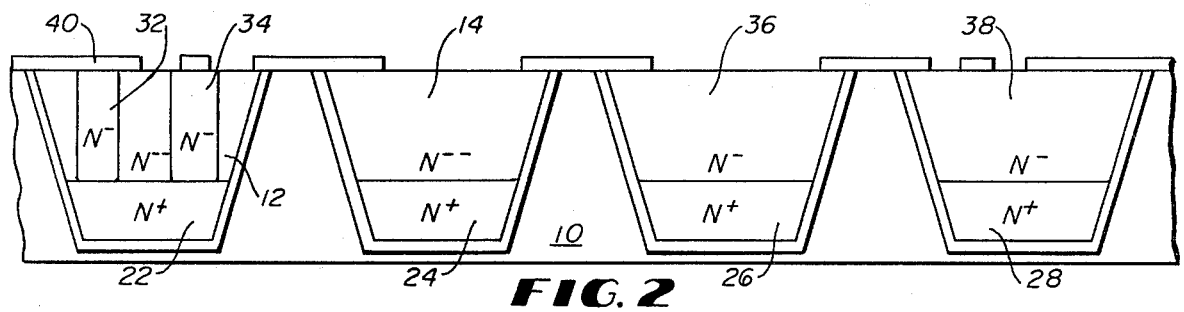
Figure 3:
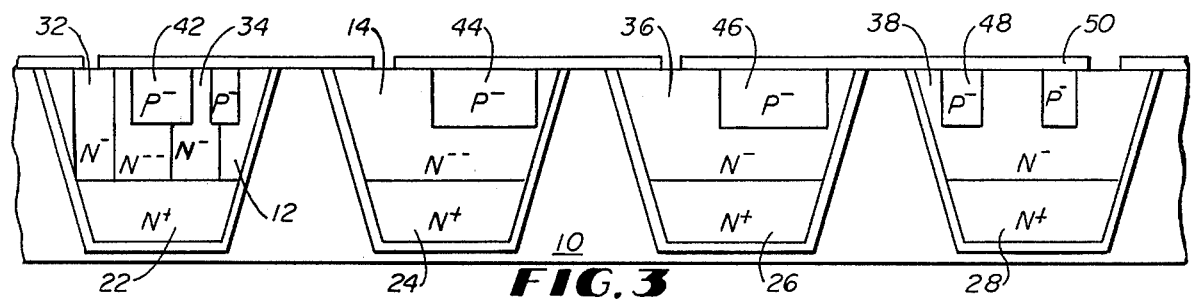
Figure 4:
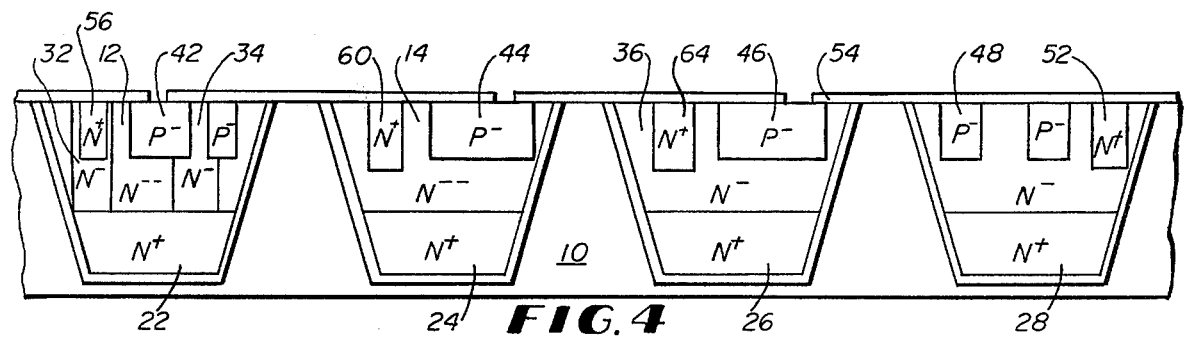

The process of the present invention begins by forming the masking layer 30 on the surface of the substrate 10 and delineating it to form two openings above island 12 and to totally expose islands 16 and 18. N conductivity type impurities, for example phosphorus are introduced by ion implantation through the openings. For example, phosphorus at $1 \times 10^{13}$ carriers per square centimeter is introduced at an energy of 100 KeV. The ion implantation is then diffused sufficiently until the N-type impurities are diffused from the surface down to the buried $N^+$ regions. As illustrated in FIG. 2, this results in two spaced $N^-$ regions 32 and 34 in island 12 and the conversion of $N^{--}$ region 16 to $N^-$ region 36 and $N^{--}$ region 18 to $N^-$ region 38. The $N^-$ regions 32, 34, 36, and 38 have an impurity concentration in the order of magnitude of at least $10^{16}$ carriers per cubic centimeter. For the ion implantation stated above, the regions have an impurity concentration of 2 to $4 \times 10^{16}$ carriers per cubic centimeter and a resistance of 0.2 to 0.3 ohm centimeters. Although the ion implantation is diffused totally down to the buried $N^+$ region, this is not necessary for region 18 into which a Schottky barrier diode is to be formed. It is important that the ion implanted region be sufficiently deep to form the body of the Schottky barrier diode. This is similarly true for regions 12 and 16.

As illustrated in FIG. 2, a new masking layer 40 is formed having apertures exposing the area surrounding the $N^-$ ion implanted region 34, a portion of $N^{--}$ region 14, a portion of $N^-$ region 36 and a circular portion of $N^-$ region 38. P-type impurities, for example boron are introduced and diffused through mask 40 to form a $P^-$ base ring 42 in island 12, a $P^-$ base 44 in island 14, a $P^-$ base 46 in $N^-$ region 36 and $P^-$ guard ring 48 in $N^-$ region 38. The $P^-$ region may have a surface impurity concentration of $5 \times 10^{18}$ carriers per cubic centimeter and a depth of for example 1.7 microns.

A third masking layer 50 is formed having an aperture therein exposing a portion of the $N^-$ region 38 external to $P^-$ guard ring 48, $N^-$ ion implanted region 32, $N^{--}$ island 14, and $N^-$ ion implanted region 36. N-type impurities are then introduced and diffused to form high concentration $N^+$ contact regions 52, 56, 60 and 64. These regions may be formed using phosphorous impurities having a surface concentration of $5 \times 10^{\circ}$ carriers per cubic centimeter and a depth of 6 microns. $N^+$ regions 52, 56, 60, and 64 are preferably deeper than the $P^-$ region 48, and may extend, if desired, down to the buried $N^+$ region 28 to form substantially low series resistance contact.

Figure 5:
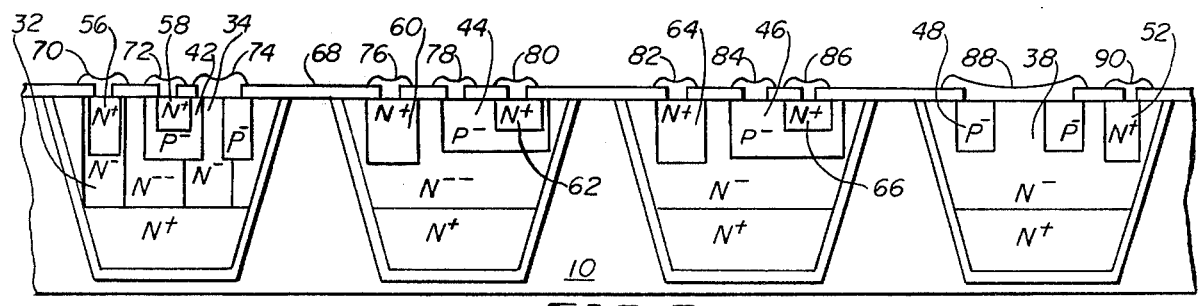

Another mask 54 is formed having openings to expose the $P^-$ region 42, $P^-$ region 44, and $P^-$ region 46. N-type impurities are then introduced to form $N^+$ regions 58, 62, and 66 as illustrated in FIG. 5. $N^+$ regions 58, 62 and 66 are emitter regions. The $N^+$ regions 58, 62, and 66 may be formed by diffusing impurities to have a surface concentration of $1 \times 10^{21}$ carriers per cubic centimeter and a depth of approximately 1.4 microns. An insulative layer 68 is then formed over the surface of the substrate and apertures are formed for the metal contacts. A layer of metal is then applied over the insulative layer 68 and delineated to produce the required contacts.

The resulting structure is illustrated in FIG. 5 and includes an NPN Schottky clamped bipolar transistor formed in island 12 having ohmic contact 70 to $N^+$ collector contact 56, ohmic contact 72 to $N^+$ emitter region 58 and a common contact 74 forming a Schottky barrier contact with $N^-$ ion implanted region 34 and ohmic contact to $P^-$ base ring 42. A standard NPN transistor having a breakdown voltage ($BV_{ceo}$) greater than 40 volts formed in island 14 includes ohmic contact 76 to $N^+$ collector contact regions 60, ohmic contact 78 to $P^-$ base region 44 and an ohmic contact 80 to $N^+$ emitter region 62. A low breakdown NPN transistor formed in region 36 having a breakdown ($BV_{ceo}$) in the range of 5 to 10 volts includes ohmic contact 82 to $N^+$ collector contact region 64, ohmic contact 84 to $P^-$ base region 46 and ohmic contact 86 to $N^+$ emitter region 66. A Schottky barrier diode formed in region 38, includes a common contact 88 forming a Schottky barrier contact with $N^+$ region 38 and an ohmic contact with the $P^-$ guard ring 48 and an ohmic contact 90 to the $N^+$ diffused contact region 52.

For a silicon substrate, aluminum is the suggested metal which forms ohmic contact with $N^+$ regions and Schottky barrier contacts with $N^-$ regions. Other types of metals may be used with a silicon substrate to form both ohmic and Schottky contacts. Also, other combinations of substrates and metals may be used.

The Schottky barrier diode formed in region 38 has a surface impurity concentration of approximately $4 \times 10^{16}$ carriers per cubic centimeter, a low V forward at 100 micro amps of approximately 0.45 volts, a reverse breakdown of approximately 15 volts, a low series resistance of approximately 300 ohms, and a low reverse leakage. Thus, the ion implantation of N-type impurities produces what is considered a useful Schottky barrier diode in high resistance starting material required to produce high voltage bipolar transistor integrated circuits. By extending the N+ contact region 52 down to buried region 28, the series of resistance can be reduced to the order of 100 to 200 ohms or less.

From the preceeding description of the preferred embodiment, it is evident that the objects of the invention are attained in that a method is provided for producing useful Schottky barrier diodes in high resistive starting materials. Although the invention has been described and illustrated in detail, it is to be clearly understood that the same is by way of illustration and example only and is not to be taken by way of limitation. The spirit and scope of the invention are to be limited only by the terms of the appended claims.

What is claimed:

1. A method of fabricating a Schottky barrier diode in an N conductivity type substrate having a bulk resistance in the range of 3 to 20 ohm-centimeters comprising:
   ion implanting and diffusing N conductivity type impurities into said substrate to form a first deep N-type region in said substrate having a surface impurity concentration the order of magnitude of $10^{16}$ carriers per cubic centimeter;
   selectively diffusing P conductivity type impurities into said first N-type region to form P-type guard ring having a depth less than the depth of said first deep N-type region;
   diffusing N conductivity type impurities into said first N-type region exterior said P-type guard ring to form a second N-type region of greater impurity concentration than said first N-type region; and
   applying and delineating a layer of metal to form a Schottky barrier contact with said first N-type region in the area interior said P-type guard ring and ohmic contact with said second N-type region.

2. The method according to claim 1 including introducing N conductivity type impurities into said substrate to form a buried layer of N conductivity type having concentration greater than said first N-type region.

3. The method according to claim 1 wherein said substrate is silicon and said metal is aluminum.

4. The method according to claim 2 wherein the depth of said P-type guard ring does not exceed the depth of said first N-type region and said second N-type region has a sufficient depth to mate with said buried N-type region.

5. A method of forming Schottky barrier diodes in an N-type substrate having a bulk resistance in the range of 3 to 20 ohm centimeters comprising:
   ion implanting and diffusing N conductivity type impurities into said substrate to form a first N-type region in said substrate having a surface impurity concentration of at least $10^{16}$ carriers per cubic centimeters;
   selectively diffusing P conductivity type impurities into said first N-type region to form a P-type guard ring of a shallower depth than said first N-type region;
   diffusing N conductivity type impurities into said first N-type region exterior said P-type guard ring to form a second N-type region of greater impurity concentration than said first N-type region and having a depth greater than said P-type guard ring; and
   applying and delineating a layer of metal to form a Schottky barrier contact with said first N-type region in the area interior said P-type guard ring and ohmic contact with said second N-type region.

6. The method according to claim 5 including introducing N conductivity impurities into said substrate to form a buried N conductivity type layer having an impurity concentration greater than said first N-type region and said second N-type region is diffused sufficiently to mate with said N-type buried layer.

7. A method of fabricating Schottky barrier diodes and NPN bipolar transistors in dielectrically isolated N conductivity islands having a bulk resistance in the range of three to twenty ohm-centimeters comprising:
   ion implanting and diffusing N conductivity type impurities into a first island to form a first deep N-type region and into a second island to form a second deep N-type region, each region having a surface impurity concentration of at least $10^{16}$ carriers per cubic centimeter;
   selectively diffusing P-type impurities into said first deep N-type region to form a P-type guard ring into said second deep N-type region to form a first base region and into a third island to form a second base region;
   diffusing N-type impurities into said first deep N-type region exterior said P-type guard ring to form a third N-type region into said second deep N-type region to form a fourth N-type region, and into said third island to form a fifth N-type region;
   diffusing N-type impurities into said first base region to form a sixth shallow N-type region, and into said second base region to form a seventh shallow N-type region;
   applying and delineating a layer of metal to form a Schottky barrier contacts with said first deep N-type region in the area interior said P-type guard ring, and to form ohmic contacts with said guard ring, said first and second base regions, said third N-type regions, said fourth and fifth N-type regions which are collector contacts and said sixth and seventh shallow N-type regions which are emitter regions.

8. The method according to claim 7 wherein said islands include N conductivity buried layers having an impurity concentration greater than said first and second deep N-type regions and said first and second deep N-type regions being diffused down and into said buried N-type layers.

9. The method according to claim 8 including fabricating a Schottky clamped NPN bipolar transistor simultaneously with said Schottky barrier diode and NPN bipolar transistors by:
   ion implanting and diffusing N-type impurities during said ion implanting and diffusion in a fourth island to form eighth and ninth deep N-type regions;
   diffusing P-type impurities during said P-type diffusion into said fourth island to form a third base ring above said ninth deep N-type region;
   diffusing N-type impurities during the second N-type diffusion into said eighth deep N-type region to form a tenth N-type region;
   diffusing N-type impurities during the third N-type diffusion into said third base ring to form an eleventh shallow N-type region; and
   applying and delineating said layer of metal to form a common Schottky barrier contact with said ninth deep N-type region and ohmic contact with said third base ring and to form ohmic contacts with said tenth N-type region which is a collector contact and said eleventh shallow N-type region which is an emitter region.

* * * * *

UNITED STATES PATENT AND TRADEMARK OFFICE
CERTIFICATE OF CORRECTION

PATENT NO. : 4,260,431
DATED : April 7, 1981
INVENTOR(S) : Leo R. Piotrowski

It is certified that error appears in the above—identified patent and that said Letters Patent is hereby corrected as shown below:

Column 3, line 10, delete "N'" and insert therefor -- N+ --.

Column 4, line 12, delete "5 x 10°" and insert therefor -- $5 \times 10^{20}$ --.

Column 5, line 4, delete "preceeding" and insert therefor -- preceding --.

Claim 2, line 4, after the word "having" insert -- an impurity --.

*Signed and Sealed this*

*Sixteenth* Day of *June 1981*

[SEAL]

*Attest:*

RENE D. TEGTMEYER

*Attesting Officer*  *Acting Commissioner of Patents and Trademarks*